(12) United States Patent
Hack et al.

(10) Patent No.: US 9,210,810 B2
(45) Date of Patent: Dec. 8, 2015

(54) METHOD OF FABRICATING FLEXIBLE DEVICES

(75) Inventors: Michael Hack, Princeton, NJ (US); Emory Krall, Philadelphia, PA (US); Ruiqing Ma, Morristown, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 542 days.

(21) Appl. No.: 13/547,985

(22) Filed: Jul. 12, 2012

(65) Prior Publication Data

US 2014/0016284 A1   Jan. 16, 2014

(51) Int. Cl.
*H05K 3/00* (2006.01)
*H05K 1/11* (2006.01)
*H05K 1/02* (2006.01)

(52) U.S. Cl.
CPC ............... *H05K 1/118* (2013.01); *H05K 1/028* (2013.01); *H05K 2201/055* (2013.01); *H05K 2201/10128* (2013.01); *Y10T 29/4913* (2015.01)

(58) Field of Classification Search
CPC .... H01L 2224/27; H05K 1/189; H05K 1/028; H05K 1/118; H05K 1/147; Y10T 29/4913; Y10T 29/49155; Y10T 29/53174
USPC ............ 29/829, 825, 832, 835, 846; 257/750; 349/150, 152
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |

(Continued)

FOREIGN PATENT DOCUMENTS

| | | |
|---|---|---|
| WO | WO 2008/057394 | 5/2008 |
| WO | WO 2010/011390 | 1/2010 |

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Thiem Phan
(74) *Attorney, Agent, or Firm* — Morris & Kamlay LLP (57) ABSTRACT

Systems and methods for the design and fabrication of flexible devices, including high-performance large-area OLEDs, narrow border display panels and lighting panels are provided. Various described fabrication- and design-processes may be used to provide the necessary electrical drive to lighting and display panels. Electrical drive may be provided to one or more row- and column-signals by patterning conductive elements near the panel edge. The electrical elements may further be folded over a region near the panel edge back on itself, such that electrical traces may route around the display edge. This may allow the display active area to be substantially the same area as its viewing area, and furthermore may allow pixels go substantially all the way to the edge of the viewing area.

20 Claims, 3 Drawing Sheets

(56) References Cited

U.S. PATENT DOCUMENTS

| | | |
|---|---|---|
| 6,303,238 B1 | 10/2001 | Thompson et al. |
| 6,337,102 B1 | 1/2002 | Forrest et al. |
| 6,468,819 B1 | 10/2002 | Kim et al. |
| 6,903,794 B2 * | 6/2005 | Fukuta et al. ............ 349/150 |
| 7,279,704 B2 | 10/2007 | Walters et al. |
| 7,431,968 B1 | 10/2008 | Shtein et al. |
| 7,968,146 B2 | 6/2011 | Wagner et al. |
| 8,847,392 B2 * | 9/2014 | Endo et al. ............ 257/750 |
| 2003/0230980 A1 | 12/2003 | Forrest et al. |
| 2004/0174116 A1 | 9/2004 | Lu et al. |

OTHER PUBLICATIONS

Baldo et al., "Very high-efficiency green organic light-emitting devices based on electrophosphorescence," Appl. Phys. Lett., vol. 75, No. 3, 4-6 (1999).

* cited by examiner

METHOD OF FABRICATING FLEXIBLE DEVICES

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

FIELD OF THE INVENTION

The present invention relates to systems and processes for fabricating display panels and lighting panels, including OLED lighting panels, and particularly for forming metal bus lines as may be used in large-area OLED lighting panels.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to aspects of the invention, systems and methods for the design and fabrication of electrical connections to a borderless flexible display or lighting panel are provided. Embodiments of the present invention solve issues related to providing the necessary electrical drive to the displays. Embodiments of the invention relate to providing electrical drive to one or more of the row signals and the column signals. In many conventional displays these signals are applied to the display by connections close to the display edge, with or without integrated functionality to multiplex these signals, provide scan drivers such as through the use of TFTs fabricated on the substrate or, else through integrated circuits bonded to the substrate near the display edge.

Embodiments of the present invention may provide a borderless flexible display by providing electrical connections from the front of the display to its back side by patterning conductive elements near the display edge. These conductive elements may then be folded over a region near the display edge back on itself, so electrical traces may route around the display edge, allowing the display active area to be the substantially the same area as its viewing area, so that the pixels go substantially all the way to the edge of the viewing area.

Aspects of the present subject matter may find applicability in devices such as displays, including OLED, liquid crystal display (LCD), electrophoretic display, electro-wetting display, electro-chromic display, electro-fluidic display, MEMS based display; lighting devices, including OLEDs, and LEDs; and other devices, such as solar cells, thin film batteries, organic electronics devices, etc.

According to first aspects of the invention, exemplary methods may include one or more steps of providing a flexible substrate having a first surface and a second surface; disposing a device having a device footprint over the first surface of the flexible substrate; disposing one or more conductors over at least a portion of a first region of the first surface of the flexible substrate; and folding the flexible substrate along the first region, wherein the fold crosses the one or more conductors.

As used herein, "folding" may be understood as bending a portion of substrate so as to create an "edge." The fold may, but need not, comprise a 180 degree bend such that the first region of the first surface overlaps with a portion of the second surface. However, embodiments are not so limited, and the fold can comprise any suitable angle (such as a 90 degree angle) or could comprise multiple bends at different locations of the substrate (e.g. two 90 degree bends). The substrate may be folded in such a way as to provide additional advantages, such as by covering all or a portion of the electronic components that may be coupled to the device.

In embodiments, the step of folding the flexible substrate may be performed after disposing the one or more conductors. In this regard, it is intended that the invention includes, without limitation, embodiments in which (1) only a partial fold is performed, then a conductor is deposited, then complete fold; (2) conductor is deposited up to (but not over) the fold region, the region is folded, and then the conductor is deposited over the fold region; or (3) the conductor is deposited over the region that will be folded (but prior to folding), and then the region is folded with the conduct. In some instances, additional conductive material may be deposited after the fold to ensure that no breaks occur or to minimize such effects that may result from the fold.

In embodiments, the step of disposing the one or more conductors over at least a portion of the first region of the first surface of the flexible substrate may include disposing the one or more conductors across the first region prior to folding the flexible substrate.

In embodiments, the step of disposing the one or more conductors over at least a portion of the first region of the first surface of the flexible substrate may include one or more steps of disposing the one or more conductors on the first surface of the substrate up to, but not across, the first region and/or, subsequent to folding the substrate along the first region, disposing the one or more conductors over the first region.

In embodiments, the step of folding the flexible substrate may include folding the substrate by at least 45 degrees.

In embodiments, the step of folding the flexible substrate may include folding the substrate by at least 90 degrees, 120 degrees, 150 degrees, or 180 degrees, or in a range of 80 to 110 degrees.

Embodiments may include one or more steps of disposing one or more conductors over at least a portion of a second region of the first surface of the flexible substrate; and/or folding the flexible substrate along the second region, wherein the fold along the second region crosses the one or more conductors.

It should be understood that aspects of the invention may include embodiments in which there are multiple folds located at the same distance from the device (e.g. embodiments in which the substrate is folded to create two edges around the device, as well as embodiments in which a the substrate is folded twice to bend the substrate around onto itself (e.g. two separate 90 degree bends to form a 180 degree bend).

In embodiments, the fold along the first region is disposed substantially perpendicular to the fold along the second region.

In embodiments, the fold along the first region may be greater than 90 degrees; and the fold along the second region may be greater than 90 degrees.

In embodiments, the fold along the first region may be disposed substantially parallel to the fold along the second region.

In embodiments, the fold along the first region may be disposed closer to the device footprint than the fold along the second region. For example, the distance in this context may refer to the perpendicular distance from device footprint to the location of the substrate where the fold is located prior to the actual folding of the substrate.

In embodiments, the fold along the first region may be disposed within 1.0 mm of the fold along the second region.

In embodiments, the fold along the first region may be between, for example, 10 degrees and 90 degrees; and the fold along the second region may be between 10 degrees and 90 degrees.

In embodiments, the step of folding the flexible substrate along the first region may be performed before the step of folding the flexible substrate along the second region.

In embodiments, the step of folding the flexible substrate may create a first edge along the first region of the flexible substrate. As used herein, an "edge" may refer to the section of the substrate in which the substrate located on side of the edge is no longer parallel (or substantially parallel) with another portion of the first surface of the substrate.

In embodiments, the device footprint may be disposed within, for example, 5.0 mm of the first edge, within 3.0 mm of the first edge, within 1.0 mm of the first edge, or at a distance that is less than the thickness of the substrate. As used in this context, the "thickness" of the substrate may refer to the dimension of the substrate that is substantially perpendicular to the first surface of the substrate on which the device is disposed on.

In embodiments, the device footprint may include an active device area and an inactive device area. The active device area may be disposed, for example within 5.0 mm of the first edge, within 3.0 mm of the first edge, within 1.0 mm of the first edge, or at a distance that is less than twice the thickness of the substrate.

In embodiments, the step of disposing the one or more conductors may include depositing a conductive layer over the first surface of the flexible substrate; and/or patterning the conductive layer to form a plurality of conductors.

In embodiments, the step of disposing the one or more conductors may include direct printing a conductive material over the first surface of the flexible substrate to form the one or more conductors; and/or depositing a conductive layer to form the one or more conductors using a vacuum process; and/or dipping the first surface of the substrate into a conductive material so as to form the one or more conductors.

In embodiments, the device may include one or more electrodes. Embodiments may include one or more steps of electrically connecting each of the one or more conductors to at least one of the electrodes.

Embodiments may include disposing one or more electronic components over the second surface of the flexible substrate.

In an embodiment of the invention, electronic components comprise a power source and or driver electronics. Furthermore, embodiments may include electrically connecting each of the one or more conductors to one or more of the electronic components.

In embodiments, the device may comprise an organic light emitting device (OLED) further comprising a top emission device. In yet another embodiment, the OLED may comprise a bottom emission device.

Embodiments may include disposing one or more electronic components over the first surface of the flexible substrate.

Embodiments may include electrically connecting each of the one or more conductors to one or more of the electronic components.

In embodiments, one more electronic components may comprise an electronics package having a surface area that is less than the first surface or the second surface of the first substrate.

Embodiments of the invention further comprise disposing a second conductive layer over the one or more conductors after folding the flexible substrate along the first region. This second conductive layer may comprise a silver paste.

Embodiments may comprise disposing a barrier layer so as to cover at least a portion of the device footprint; a portion a side of the device footprint; or a portion of the one or more conductors.

In embodiments the flexible substrate may have a third edge and a fourth edge, such that the first region extends from the third edge to the fourth edge. This may include embodiments in which the fold across the region extends across the entire surface of the substrate (i.e. the fold extends from one side of the substrate to another side of the substrate).

In, embodiments of the invention the device may include one or more of the following: an OLED, an LED, a solar cell, a thin film battery, an OLED display, an LED display, an electrophoretic display, an electro-wetting display, an electro-chromic display, an electro-fluidic display, MEMS based display, or an organic electronics device.

An embodiment of the invention includes a product having a first substrate with a first surface and a second surface, wherein the first surface comprises a first region, wherein the first substrate is folded along the first region. A device having a device footprint may be disposed over the first surface of the first substrate. Furthermore one or more conductors may be disposed over the first surface of the first substrate such that the one or more conductors are disposed across the first region of the first substrate. As used in this context, a conductor may be "disposed across" a first region if the conductor is disposed over the first region and also disposed on the first surface on either side of the first region. For example, the first surface of the first substrate could comprise a first portion and a second portion, where the first region is disposed between the first and second portions. The conductor may thereby be disposed over a portion of the first and second portions, as well as over the first region, and thereby be disposed across the first region.

In embodiments, the first substrate may be folded along the first region to an angle of: at least 45 degrees, at least 90 degrees, at least 120 degrees, at least 150 degrees, 180 degrees, or any other suitable angle.

In embodiments of the invention the first surface may comprise a second region, wherein the first substrate is folded along the second region; and such that one or more conductors are disposed across the second region of the first substrate.

In embodiments, the first region may be disposed substantially parallel to the second region. In other embodiments, the first region may be disposed substantially perpendicular to the second region.

In embodiments, the product may comprise: alighting panel, a display, a solar cell; a thin film battery, or an organic electronics device.

In embodiments that comprise a display, the display may further comprise one or more of: an OLED display, a liquid crystal display (LCD), an electrophoretic display, an electro-wetting display, an electro-chromic display, an electro-fluidic display, or a MEMS based display.

In embodiments of the invention, the first substrate may be flexible.

In embodiments of the invention, first region may be disposed within 5.0 mm of the device footprint. In other embodiments, the first region may disposed within 3.0 mm of the device footprint. In yet other embodiments, the first region may be disposed within 1.0 mm of the device footprint.

In embodiments, the device may comprise a top emitting organic light emitting device. In other embodiments, the device may comprise a bottom emitting organic light emitting device.

In embodiments of the invention, the first device may comprise a first electrode with one or more electrical conductors electrically connected to it.

Embodiments of the invention may comprise a second substrate having a third surface with a third region covering a part of the surface and a fourth surface. The second substrate may be folded along the third region. The device may have a device footprint disposed over the third surface of the second substrate and one or more conductors disposed over the third surface of the second substrate, wherein the one or more conductors are disposed across the third region of the second substrate. Furthermore, conductors disposed over the first surface of the first substrate may be electrically coupled to the conductors disposed over the third surface of the second substrate.

In embodiments, the conductors disposed over the first surface of the first substrate may be in direct contact with the conductors disposed over the third surface of the second substrate.

In embodiments, the first substrate may be folded along the first region to an angle of at least 45 degrees; and the second substrate may be folded along the third region to an angle of at least 45 degrees. In other embodiments, the first substrate may be folded along the first region to an angle of at least 90 degrees; and the second substrate may be folded along the third region to an angle of at least 90 degrees.

Embodiments of the invention also include a number of substrates disposed adjacent to the first substrate, such that each of the substrates comprises a first surface and a second surface, and the first surface comprises a first region, and wherein each of the plurality of substrate is folded along the first region. Furthermore, embodiments may include a plurality of devices each having a device footprint disposed over the first surface of each of the substrates and one or more conductors disposed over the first surface of each of the plurality of substrates, such that the conductors disposed over the first surface of each of the substrates are disposed across the first region of each of the substrates.

In embodiments, at least one of the conductors disposed over the first surface of each of the substrates may be electrically coupled to at least one of the conductors disposed over the first surface of each of the other plurality of substrates. There may be a single substrate, or any other number of substrates such as one or two substrates or a much larger number.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
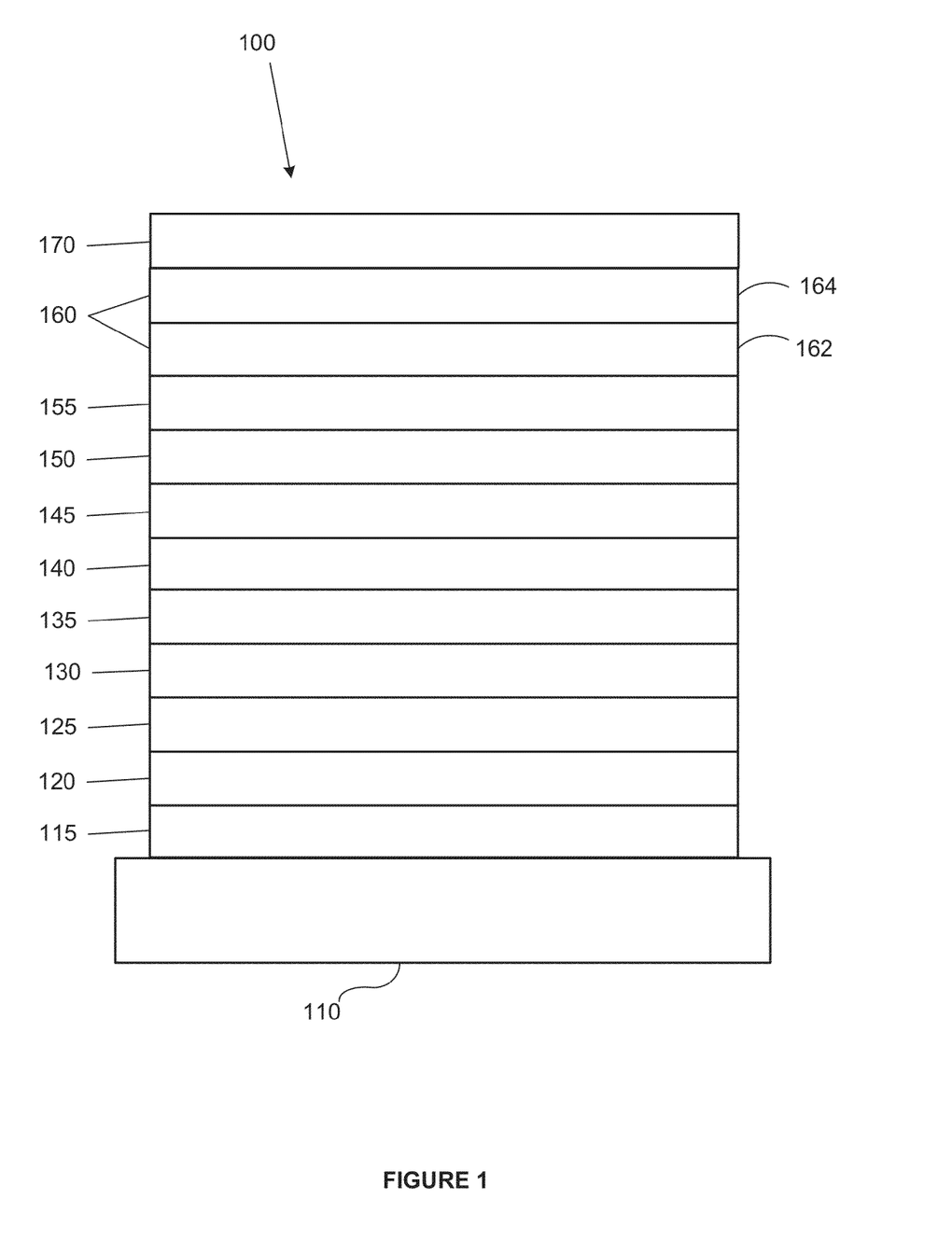
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
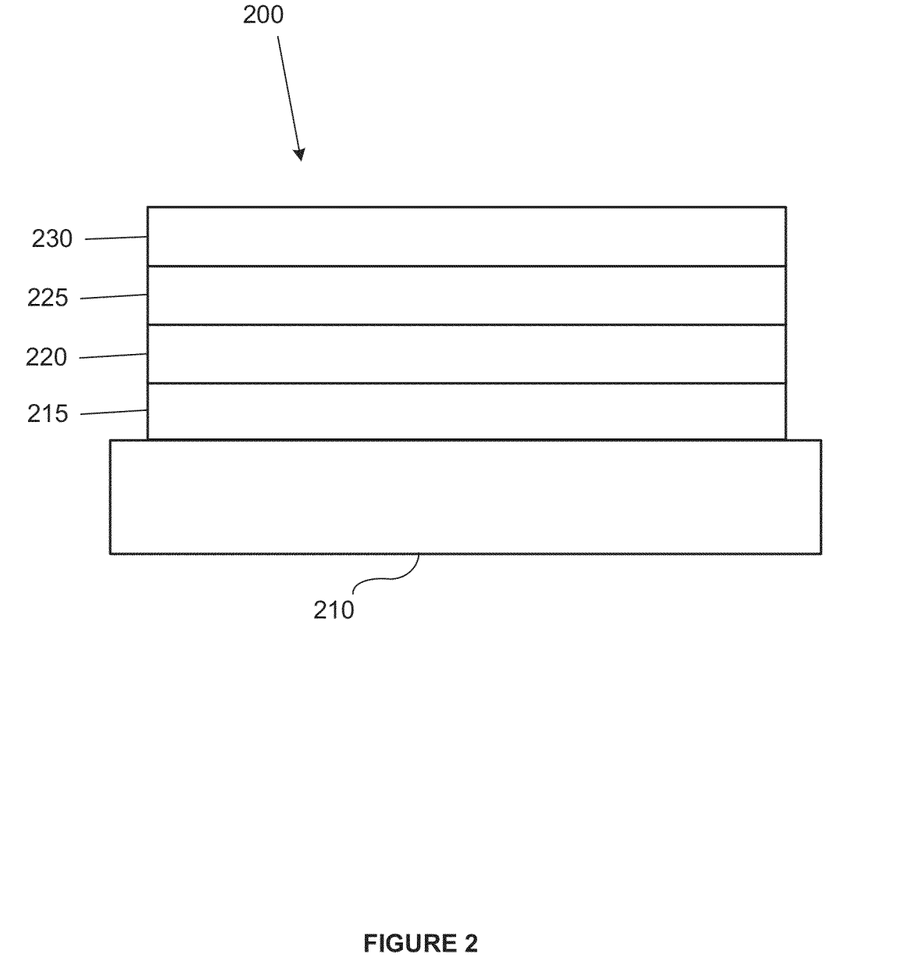
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
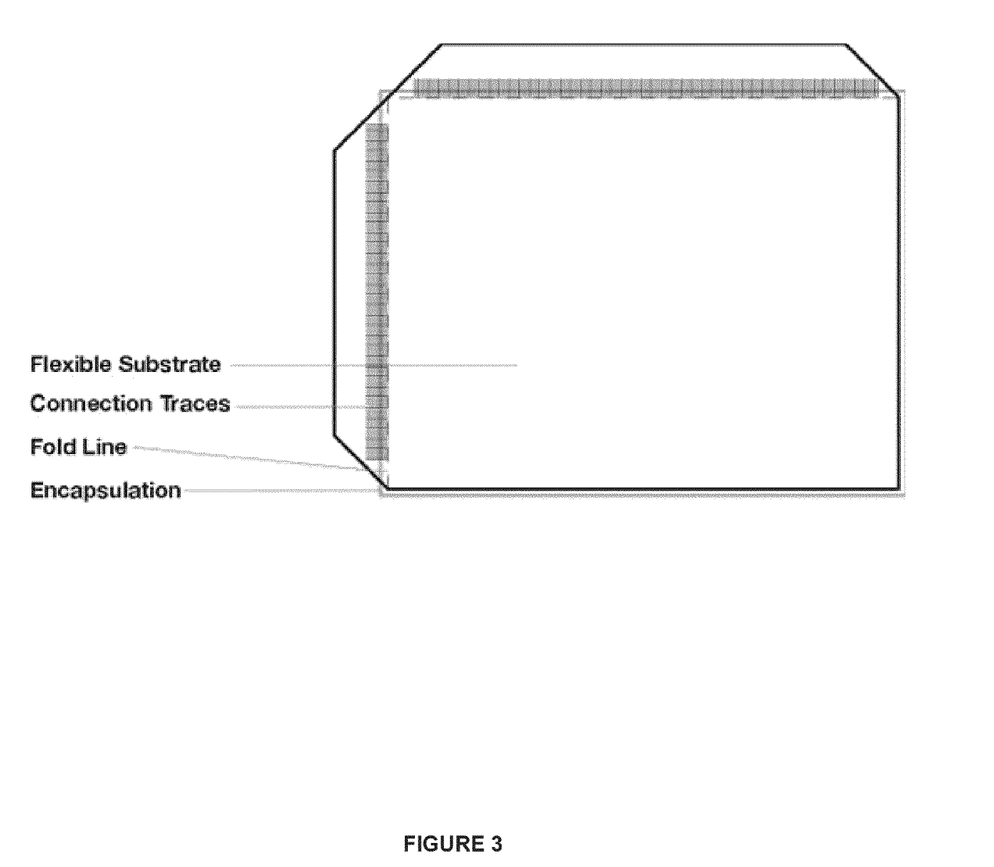
FIG. 3 shows an embodiment of the present invention including electrical connections for the row and column lines to a display.

In embodiments of the invention, electrical connections may be desirable to drive the row and column lines of a display. This may accomplished by electrical connections to at least one or more edges of the display, and in many cases to two edges, as shown in FIG. 3. The front surface of the display may be patterned with row and column bus lines as part of the display fabrication. Embodiments of the present invention relate to patterning these lines (or continuing existing row and column lines) beyond a specific fold line defined on the substrate. The active area of the display may be bound by the fold lines. The substrate beyond the fold line may be bent around to the back of the display, providing electrical connectivity between the front and back surface of the display. This may enable the display viewing area to be located closer to the display edge, after the fold has been made. This method may also apply to a top emission display or else a reflective display medium, such as an electrophoretic or electrowetting display.

Conductive traces around the fold zone may be patterned by conventional deposition methods (sputtering and evaporation and similar methods) and then patterned by lithography, or else patterned by direct printing of a conductive ink. Desirability of a very flexible conductor around the fold zone may be met by a different conductive material from that used for the row and column bus lines on the display front surface; otherwise else they may be the same lines. In another embodiment of the invention the potential damage (due to bending) to the conduction of leads may be addressed by adding an extra step: after bending a second layer of conductive material may be applied to the top of the original conductive leads while the substrate is in the bent state. This may be realized by using materials such as silver paste or electroplating a second conductive material.

Once conductive connections to row and column lines are enabled on the backside of the display, appropriate driver electronics may be attached to these connections to enable the display to operate.

While the above description has been made with reference to a display device, the same techniques may be used with a number of different types of display, lighting and other types of devices, including an OLED lighting device where simpler connections are used.

According to aspects of the invention, systems and methods for the design and fabrication of electrical connections to a borderless flexible display or a device with narrow borders are provided. Embodiments of the present invention solve issues related to providing the necessary electrical drive to the displays. Embodiments of the invention relate to providing electrical drive to one or more of the row signals and the column signals. In many conventional displays these signals are applied to the display by connections close to the display edge, with or without integrated functionality to multiplex these signals, provide scan drivers such as through the use of TFTs fabricated on the substrate or, else through integrated circuits bonded to the substrate near the display edge.

Aspects of the present subject matter may find applicability in devices such as displays, including OLED, liquid crystal display (LCD), electrophoretic display, electro-wetting display, electro-chromic display, electro-fluidic display, MEMS based display; lighting devices, including OLEDs, and LEDs; and other devices, such as solar cells, thin film batteries, organic electronics devices, etc.

According to first aspects of the invention, exemplary methods may include one or more steps of providing a flexible substrate having a first surface and a second surface; disposing a device having a device footprint over the first surface of the flexible substrate; disposing one or more conductors over at least a portion of a first region of the first surface of the flexible substrate; and folding the flexible substrate along the first region, wherein the fold crosses the one or more conductors.

As used herein, "folding" may be understood as bending a portion of substrate so as to create an "edge." The fold may, but need not, comprise a 180 degree bend such that the first region of the first surface overlaps with a portion of the second surface. However, embodiments are not so limited, and the fold can comprise any suitable angle (such as a 90 degree angle) or could comprise multiple bends at different locations of the substrate (e.g. two 90 degree bends). The substrate may be folded in such a way as to provide additional advantages, such as by covering all or a portion of the electronic components that may be coupled to the device. The angles described herein may not be true angles, but rather a radius of curvature sufficient to minimize issues due to the fold.

In an embodiment of the invention, the invention is used in conjunction with TFT panels in order to create a borderless design. For example, the substrate connected to the TFT panel may be folded as to not be visible from normal viewing-angles of the panel.

In embodiments, the step of folding the flexible substrate may be performed after disposing the one or more conductors. In this regard, it is intended that the invention includes, without limitation, embodiments in which (1) only a partial fold is performed, then a conductor is deposited, then complete fold; (2) conductor is deposited up to (but not over) the fold region, the region is folded, and then the conductor is deposited over the fold region; or (3) the conductor is deposited over the region that will be folded (but prior to folding), and then the region is folded with the conduct. In some instances, additional conductive material may be deposited after the fold to ensure that no breaks occur or to minimize such effects that may result from the fold.

In embodiments, the step of disposing the one or more conductors over at least a portion of the first region of the first surface of the flexible substrate may include disposing the one or more conductors across the first region prior to folding the flexible substrate.

In embodiments, the step of disposing the one or more conductors over at least a portion of the first region of the first surface of the flexible substrate may include one or more steps of disposing the one or more conductors on the first surface of the substrate up to, but not across, the first region and/or, subsequent to folding the substrate along the first region, disposing the one or more conductors over the first region.

In embodiments, the step of folding the flexible substrate may include folding the substrate by at least 45 degrees.

In embodiments, the step of folding the flexible substrate may include folding the substrate by at least 90 degrees, 120 degrees, 150 degrees, or 180 degrees, or in a range of 80 to 110 degrees.

Embodiments may include one or more steps of disposing one or more conductors over at least a portion of a second region of the first surface of the flexible substrate; and/or folding the flexible substrate along the second region, wherein the fold along the second region crosses the one or more conductors.

It should be understood that aspects of the invention may include embodiments in which there are multiple folds located at the same distance from the device (e.g. embodiments in which the substrate is folded to create two edges around the device, as well as embodiments in which a the substrate is folded twice to bend the substrate around onto itself (e.g. two separate 90 degree bends to form a 180 degree bend).

In embodiments, the fold along the first region is disposed substantially perpendicular to the fold along the second region.

In embodiments, the fold along the first region may be greater than 90 degrees; and the fold along the second region may be greater than 90 degrees.

In embodiments, the fold along the first region may be disposed substantially parallel to the fold along the second region.

In embodiments, the fold along the first region may be disposed closer to the device footprint than the fold along the second region. For example, the distance in this context may refer to the perpendicular distance from device footprint to the location of the substrate where the fold is located prior to the actual folding of the substrate.

In embodiments, the fold along the first region may be disposed within 1.0 mm of the fold along the second region.

In embodiments, the fold along the first region may be between, for example, 10 degrees and 90 degrees; and the fold along the second region may be between 10 degrees and 90 degrees.

In embodiments, the step of folding the flexible substrate along the first region may be performed before the step of folding the flexible substrate along the second region.

In embodiments, the step of folding the flexible substrate may create a first edge along the first region of the flexible substrate. As used herein, an "edge" may refer to the section of the substrate in which the substrate located on side of the edge is no longer parallel (or substantially parallel) with another portion of the first surface of the substrate.

In embodiments, the device footprint may be disposed within, for example, 5.0 mm of the first edge, within 3.0 mm of the first edge, within 1.0 mm of the first edge, or at a distance that is less than the thickness of the substrate. As used in this context, the "thickness" of the substrate may refer to the dimension of the substrate that is substantially perpendicular to the first surface of the substrate on which the device is disposed on.

In embodiments, the device footprint may include an active device area and an inactive device area. The active device area may be disposed, for example within 5.0 mm of the first edge, within 3.0 mm of the first edge, within 1.0 mm of the first edge, or at a distance that is less than twice the thickness of the substrate.

In embodiments, the step of disposing the one or more conductors may include depositing a conductive layer over the first surface of the flexible substrate; and/or patterning the conductive layer to form a plurality of conductors.

In embodiments, the step of disposing the one or more conductors may include direct printing a conductive material over the first surface of the flexible substrate to form the one or more conductors; and/or depositing a conductive layer to form the one or more conductors using a vacuum process; and/or dipping the first surface of the substrate into a conductive material so as to form the one or more conductors.

In embodiments, the device may include one or more electrodes. Furthermore, each of the one or more conductors may be electrically connected to at least one of the electrodes.

Embodiments may further include disposing one or more electronic components over the second surface of the flexible substrate.

In an embodiment of the invention, electronic components may include a power source and/or driver electronics. Furthermore, each of the one or more conductors may be connected to one or more of the electronic components.

In embodiments, the device may include an organic light emitting device (OLED) further including a top emission device. In yet another embodiment, the OLED may include a bottom emission device.

Embodiments may include disposing one or more electronic components over the first surface of the flexible substrate.

In embodiments, one more electronic components may comprise an electronics package that has a surface area that is less than the first surface or the second surface of the first substrate.

Embodiments of the invention further include disposing a second conductive layer over the one or more conductors after folding the flexible substrate along the first region. This second conductive layer may comprise a silver paste.

Embodiments may comprise disposing a barrier layer so as to cover at least a portion of the device footprint; a portion a side of the device footprint; or a portion of the one or more conductors.

In embodiments the flexible substrate may have a third edge and a fourth edge, such that the first region extends from the third edge to the fourth edge. This may include embodiments in which the fold across the region extends across the entire surface of the substrate (i.e. the fold extends from one side of the substrate to another side of the substrate).

In embodiments, the device may include one or more of the following: an OLED, an LED, a solar cell, a thin film battery, an OLED display, an LED display, an electrophoretic display, an electro-wetting display, an electro-chromic display, an electro-fluidic display, MEMS based display, or an organic electronics device.

An embodiment of the invention includes a product having a first substrate with a first surface and a second surface, wherein the first surface comprises a first region, wherein the first substrate is folded along the first region. A device having a device footprint may be disposed over the first surface of the first substrate. Furthermore one or more conductors may be disposed over the first surface of the first substrate such that the one or more conductors are disposed across the first region of the first substrate. As used in this context, a conductor may be "disposed across" a first region if the conductor is disposed over the first region and also disposed on the first surface on either side of the first region. For example, the first surface of the first substrate could comprise a first portion and a second portion, where the first region is disposed between the first and second portions. The conductor may thereby be disposed over a portion of the first and second portions, as well as over the first region, and thereby be disposed across the first region.

In embodiments, the first substrate may be folded along the first region to an angle of: at least 45 degrees, at least 90 degrees, at least 120 degrees, at least 150 degrees, 180 degrees, or any other suitable angle.

In embodiments of the invention the first surface may comprise a second region, wherein the first substrate is folded along the second region such that one or more conductors are disposed across the second region of the first substrate.

In embodiments, the first region may be disposed substantially parallel to the second region. In other embodiments, the first region may be disposed substantially perpendicular to the second region.

In embodiments, the product may include: a lighting panel, a display, a solar cell; a thin film battery, and/or an organic electronics device.

In embodiments that include a display, the display may further include one or more of: an OLED display, a liquid crystal display (LCD), an electrophoretic display, an electro-wetting display, an electro-chromic display, an electro-fluidic display, and/or a MEMS based display.

In embodiments of the invention, the first substrate may be flexible.

In embodiments of the invention, the first region may be disposed within 5.0 mm of the device footprint. In other embodiments, the first region may disposed within 3.0 mm of the device footprint. In yet other embodiments, the first region may be disposed within 1.0 mm of the device footprint.

In embodiments, the device may comprise a top emitting organic light emitting device. and/or a bottom emitting organic light emitting device.

In embodiments of the invention, the first device may comprise a first electrode with one or more electrical conductors electrically connected to it.

Embodiments of the invention may comprise a second substrate having a third surface with a third region covering a part of the surface and a fourth surface. The second substrate may be folded along the third region. The device may have a device footprint disposed over the third surface of the second substrate and one or more conductors disposed over the third surface of the second substrate. One or more of the conductors may be disposed across the third region of the second substrate. Furthermore, conductors disposed over the first surface of the first substrate may be electrically coupled to the conductors disposed over the third surface of the second substrate.

In embodiments, the conductors disposed over the first surface of the first substrate may be in direct contact with the conductors disposed over the third surface of the second substrate.

In embodiments, the first substrate may be folded along the first region to an angle of at least 45 degrees; and the second substrate may be folded along the third region to an angle of at least 45 degrees. In other embodiments, the first substrate may be folded along the first region to an angle of at least 90 degrees; and the second substrate may be folded along the third region to an angle of at least 90 degrees.

Embodiments of the invention may further include a number of substrates disposed adjacent to the first substrate, such that each of the substrates comprises a first surface and a second surface, and the first surface comprises a first region, and wherein each of the plurality of substrate is folded along the first region. Furthermore, embodiments may include a plurality of devices each having a device footprint disposed over the first surface of each of the substrates and one or more conductors disposed over the first surface of each of the plurality of substrates, such that the conductors disposed over the first surface of each of the substrates are disposed across the first region of each of the substrates.

In embodiments, at least one of the conductors disposed over the first surface of each of the substrates may be electrically coupled to at least one of the conductors disposed over the first surface of each of the other plurality of substrates. There may be a single substrate, or any other number of substrates such as one or two substrates or a much larger number.

Embodiments may also include an organic light emitting device. The device may include an anode, a cathode, and an organic emissive layer disposed between the anode and the cathode. The organic emissive layer may include a host and a phosphorescent dopant.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrite, isonitrile, sulfanyl, sulfonyl, sulfonyl, phosphino, and combinations thereof.

In one aspect, $Ar^1$ to $Ar^9$ is independently selected from the group consisting of:

k is an integer from 1 to 20; $X^1$ to $X^8$ is C (including CH) or N; $Ar^1$ has the same group defined above.

Examples of metal complexes used in HIL or HTL include, but not limit to the following general formula:

M is a metal, having an atomic weight greater than 40; ($Y^1$-$Y^2$) is a bidentate ligand, $Y^1$ and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, ($Y^1$-$Y^2$) is a 2-phenylpyridine derivative.
In another aspect, ($Y^1$-$Y^2$) is a carbene ligand.
In another aspect, M is selected from Ir, Pt, Os, and Zn.
In a further aspect, the metal complex has a smallest oxidation potential in solution vs. $Fc^+$/Fc couple less than about 0.6 V.

Host:
The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

M is a metal; ($Y^3$-$Y^4$) is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

(O—N) is a bidentate ligand, having metal coordinated to atoms O and N.

In another aspect, M is selected from Ir and Pt.
In a further aspect, ($Y^3$-$Y^4$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrite, isonitrile, sulfanyl, sulfinyl, sulfonyl, phosphino, and combinations thereof.

In one aspect, host compound contains at least one of the following groups in the molecule:

$R^1$ to $R^7$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfanyl, sulfonyl, phosphino, and combinations thereof, when it is aryl or heteroaryl, it has the similar definition as Ar's mentioned above.

k is an integer from 0 to 20.

$X^1$ to $X^8$ is selected from C (including CH) or N.

$Z^1$ and $Z^2$ is selected from $NR^1$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HSL contains the same molecule or the same functional groups used as host described above.

In another aspect, compound used in HBL contains at least one of the following groups in the molecule:

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

$R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from C (including CH) or N.

In another aspect, the metal complexes used in ETL contains, but not limit to the following general formula:

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method, comprising:
   providing a flexible substrate having a first surface and a second surface;
   disposing a flexible Organic Light Emitting Device (OLED) having a device footprint over the first surface of the flexible substrate;
   disposing one or more conductors over at least a portion of a first region of the first surface of the flexible substrate;
   disposing a continuous barrier layer over the first surface of the flexible substrate; and
   folding the flexible substrate along the first region, wherein the fold crosses the one or more conductors.

2. The method of claim 1, wherein the step of folding the flexible substrate is performed after disposing the one or more conductors.

3. The method of claim 1, wherein the step of disposing the one or more conductors over at least a portion of the first region of the first surface of the flexible substrate comprises:
   disposing the one or more conductors on the first surface of the substrate up to, but not across, the first region; and subsequent to folding the substrate along the first region, disposing the one or more conductors over the first region.

4. The method of claim 1, wherein the step of folding the flexible substrate comprises folding the substrate by at least 45 degrees.

5. The method of claim 1, wherein the method further comprises the steps of:
disposing one or more conductors over at least a portion of a second region of the first surface of the flexible substrate; and
folding the flexible substrate along the second region, wherein the fold along the second region crosses the one or more conductors.

6. The method of claim 5, wherein the fold along the first region is disposed substantially perpendicular to the fold along the second region.

7. The method of claim 5, wherein the fold along the first region is disposed substantially parallel to the fold along the second region.

8. The method of claim 5, wherein the fold along the first region is disposed closer to the device footprint than the fold along the second region.

9. The method in claim 1, wherein the step of folding the flexible substrate creates a first edge along the first region of the flexible substrate.

10. The method of claim 9, wherein the device footprint is disposed within 5.0 mm of the first edge.

11. The method of claim 9,
wherein the device footprint comprises an active area and an inactive device area, and
wherein the active device area is disposed within 5.0 mm of the first edge.

12. The method of claim 9, wherein the device footprint is disposed within 1.0 mm of the first edge.

13. The method of claim 1, wherein the step of disposing the one or more conductors comprises:
depositing a conductive layer over the first surface of the flexible substrate; and
patterning the conductive layer to form a plurality of conductors.

14. The method of claim 1, wherein the step of disposing the one or more conductors comprises at least one step for:
direct printing a conductive material over the first surface of the flexible substrate to form the one or more conductors;
depositing a conductive layer to form the one or more conductors using a vacuum process; and
dipping the first surface of the substrate into a conductive material so as to form the one or more conductors.

15. The method of claim 1,
wherein the flexible substrate has a third edge and a fourth edge; and
wherein the first region extends from the third edge to the fourth edge.

16. A product, comprising:
a first substrate having a first surface and a second surface, wherein the first surface comprises a first region;
a flexible Organic Light Emitting Device (OLED) having a device footprint disposed over the first surface of the first substrate;
one or more conductors disposed over the first surface of the first substrate, wherein the one or more conductors are disposed across the first region of the first substrate; and
a continuous barrier layer disposed over the first surface of the first substrate, wherein the first substrate is folded along the first region and the fold crosses the one or more conductors.

17. The product of claim 16,
wherein the first surface comprises a second region, wherein the first substrate is folded along the second region; and
wherein the one or more conductors are disposed across the second region of the first substrate.

18. The product of claim 16, wherein the product comprises a display and wherein the display comprises an OLED display.

19. The product of claim 16, further comprising:
a second substrate having a third surface and a fourth surface, wherein the third surface comprises a third region, wherein the second substrate is folded along the third region;
a device having a device footprint disposed over the third surface of the second substrate; and
one or more conductors disposed over the third surface of the second substrate, wherein the one or more conductors are disposed across the third region of the second substrate;
wherein the one or more conductors disposed over the first surface of the first substrate are electrically coupled to the one or more conductors disposed over the third surface of the second substrate.

20. The product of claim 19, further comprising:
a plurality of substrates disposed adjacent to the first substrate, wherein each of the plurality of substrates comprises a first surface and a second surface, wherein the first surface comprises a first region, and wherein each of the plurality of substrate is folded along the first region;
a plurality of devices each having a device footprint disposed over the first surface of each of the plurality of substrates; and
one or more conductors disposed over the first surface of each of the plurality of substrates, wherein the one or more conductors disposed over the first surface of each of the plurality of substrates are disposed across the first region of each of the substrates.

* * * * *